(12) United States Patent
Kim

(10) Patent No.: US 7,419,899 B2
(45) Date of Patent: Sep. 2, 2008

(54) METHOD FOR MANUFACTURING SEMICONDUCTOR DEVICE

(75) Inventor: Jea Hee Kim, Suwon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 71 days.

(21) Appl. No.: 11/442,770

(22) Filed: May 30, 2006

(65) Prior Publication Data

US 2006/0276025 A1    Dec. 7, 2006

(30) Foreign Application Priority Data

Jun. 2, 2005    (KR) ...................... 10-2005-0047194

(51) Int. Cl.
*H01L 21/4763* (2006.01)
(52) U.S. Cl. .......................... 438/618; 438/401; 257/797
(58) Field of Classification Search ................ 438/401, 438/460, 463, 940, 618; 257/797, E21.002
See application file for complete search history.

(56) References Cited

U.S. PATENT DOCUMENTS

| 7,172,948 B2 * | 2/2007 | Fang et al. .................. 438/401 |
| 2002/0090793 A1 * | 7/2002 | Kawano ..................... 438/401 |

* cited by examiner

*Primary Examiner*—Phuc T Dang
(74) *Attorney, Agent, or Firm*—Saliwanchik, Lloyd & Saliwanchik

(57) ABSTRACT

A method for manufacturing a semiconductor device comprises forming a laser marking, forming a trench pattern, forming a metal interconnection layer, removing a predetermined portion of the metal interconnection layer, and planarizing the metal interconnection layer. The laser marking is formed in a first region of a wafer, and the first region has a first width from an edge of the wafer. The trench pattern is formed above the wafer except for above the first region. The metal interconnection layer is formed above the wafer where the laser marking and the trench pattern are formed. The predetermined portion of the metal interconnection layer is removed, and the predetermined portion has a second width from the edge of the wafer equal to or greater than the first width. And the metal interconnection layer above the wafer where the trench pattern is formed is planarized to a predetermined thickness.

12 Claims, 5 Drawing Sheets

METHOD FOR MANUFACTURING SEMICONDUCTOR DEVICE

CROSS-REFERENCE TO RELATED APPLICATION

The present application claims the benefit under 35 U.S.C. §119 of Korean Patent application No. 10-2005-0047194, filed on Jun. 2, 2005.

FIELD OF THE INVENTION

The present invention relates to a method for manufacturing a semiconductor device, and more particularly, to a method for manufacturing a semiconductor device that can prevent peeling of a metal interconnection layer, especially a copper interconnection line, in a photo etch process.

BACKGROUND

Generally, a laser marking is formed in the wafer so as to identify wafer.

Referring to FIG. 1, a laser marking 20 is formed at an edge portion of a wafer 10. As a semiconductor device is highly integrated, the number of metal layers also increases. Thus, the depth D of the laser marking 20 increases so as to identify each metal layer even when all processes of forming the metal layers are carried out. When a laser is used to form the laser marking 20, a protrusion 22 is formed as a by-product of forming the laser marking 20 and the height H of the protrusion 22 also increases.

Referring to FIG. 2, after forming the laser marking 20 on the wafer 10, a plurality of trench patterns 40 are formed over an entire area of the wafer 10 except an area ranging from an edge of the wafer 10 to a first distance D1 by using a wafer edge exclusion (WEE) of a trench photo etch process (PEP) of a Damascene process.

Next, a copper film is formed on an entire surface of the wafer 10 to fill the laser marking 20 and each trench region 40.

Then, the copper film 30 disposed from the edge of the wafer 10 to a second distance D2 is removed using an edge bead removal (EBR) process.

An object of the EBR process is to remove a predetermined edge portion of the wafer 10 using chemicals, because several contamination problems are caused by the formation of the copper film 30 at the edge portion of the wafer 10.

However, as illustrated in FIG. 3A, a defect is caused by the protrusion 22 as a by-product of forming the laser marking 20. The defect results from a Cu belt formed by an interval between a trench WEE and EBR in a dual Damascene process. If the trench WEE is smaller than the EBR, an unfilled trench pattern collapses during the planarization process and the collapsed unfilled trench pattern serves as a particle source. Therefore, to prevent this phenomenon, the trench WEE is set to be greater than EBR.

Accordingly, if the Cu belt exists in a region encountering the laser marking 20, a step between the protrusion 22 and the trench pattern 40 increases. Thus, there occurs a problem that the Cu film 30 is peeled off in a planarization process.

SUMMARY OF THE INVENTION

Accordingly, the present invention is directed to a method for manufacturing a semiconductor device that substantially obviates one or more problems due to limitations and disadvantages of the related art.

An object of the present invention is to provide a method for manufacturing a semiconductor device that can prevent the peeling of a copper film by adjusting an interval among WEE, ECP EBR, and laser marking in a trench PEP.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method for manufacturing a semiconductor device, including: forming a laser marking in a first region of a wafer, the first region having a first width from an edge of the wafer; forming a trench pattern above the wafer except the first region; forming a metal interconnection layer above the wafer where the laser marking and the trench pattern are formed; removing a predetermined portion of the metal interconnection layer, the predetermined portion having a second width from the edge of the wafer equal to or greater than the first width; and planarizing the metal interconnection layer above the wafer where the trench pattern is formed to a predetermined thickness.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method for manufacturing a semiconductor device according to the present invention will be described in detail with reference to the accompanying drawings.

FIGS. 4A to 4F are sectional views illustrating a method for manufacturing a semiconductor device according to an embodiment of the present invention.

Figure 1:
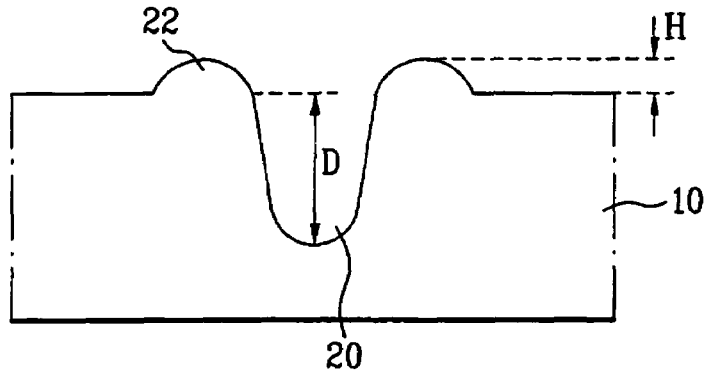
FIG. 1 is a sectional view of a prior art semiconductor device having a laser marking.
Figure 2:
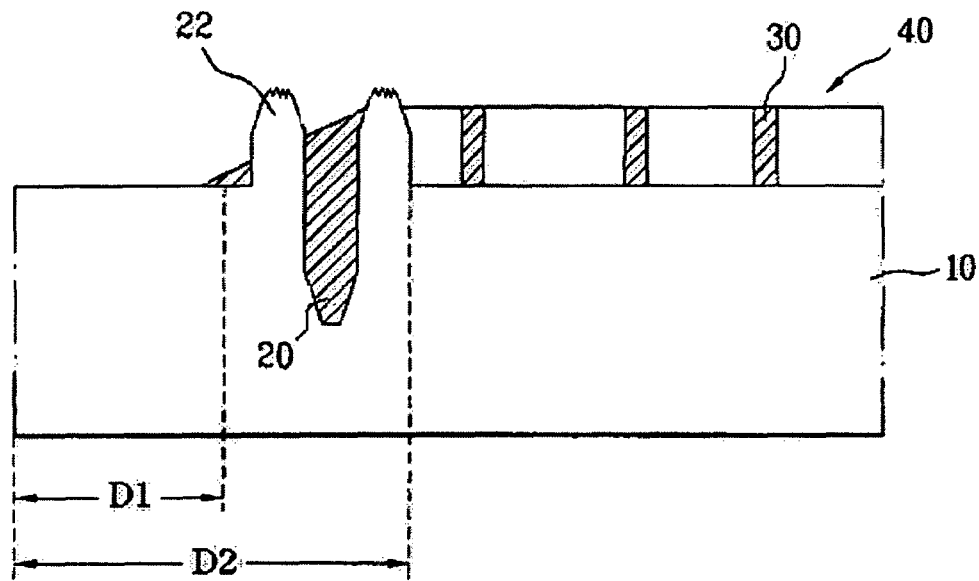
FIG. 2 is a sectional view illustrating a prior art method for manufacturing a semiconductor device having a laser marking formed in a wafer.
Figure 3A:
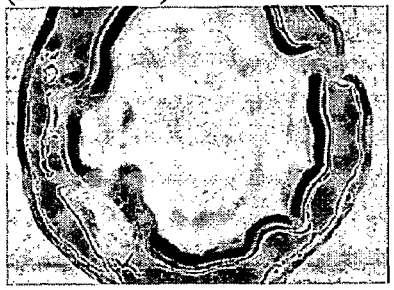
FIGS. 3A and 3B are photographs illustrating the peeling of a copper film from a device is depicted in FIG. 2.
Figure 3B:
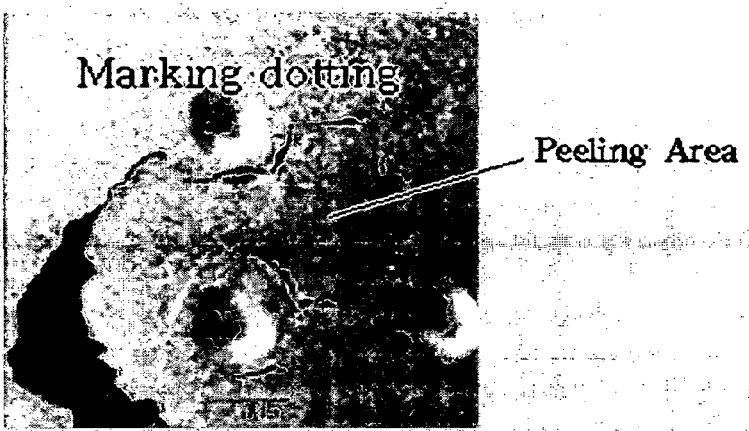
Figure 4A:
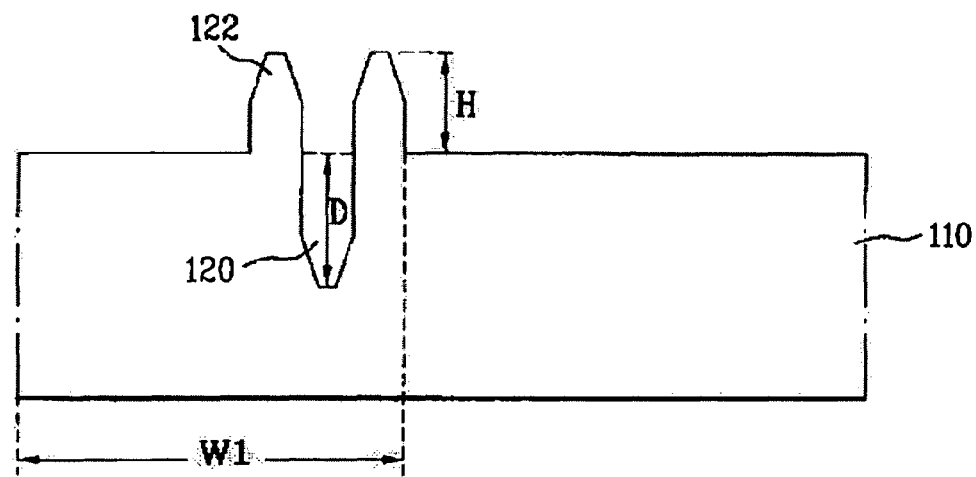
FIGS. 4A to 4F are sectional views illustrating a method for forming a semiconductor device according to an embodiment of the present invention.

Referring to FIG. 4A, a laser marking 120 can be formed in a first region having a first width W1 from an edge of the wafer 110.

In this embodiment, the laser marking 120 can be formed in a region within about 3 mm from the edge of the wafer 110. Specifically, the laser marking 120 can be formed in a region having the first width W1 about 2.5 mm to about 3.0 mm from the edge of the wafer 110. Therefore, the peeling of the copper film can be effectively prevented by setting the first width W1 to about 2.5 mm to about 3.0 mm from the edge of the wafer 110 and by adjusting the intervals among WEE, ECP EBR, and the laser marking in the trench PEP.

Meanwhile, due to the depth D of the laser marking 120, a protrusion 122 having a predetermined height H is formed around the laser marking 120.

Figure 4B:
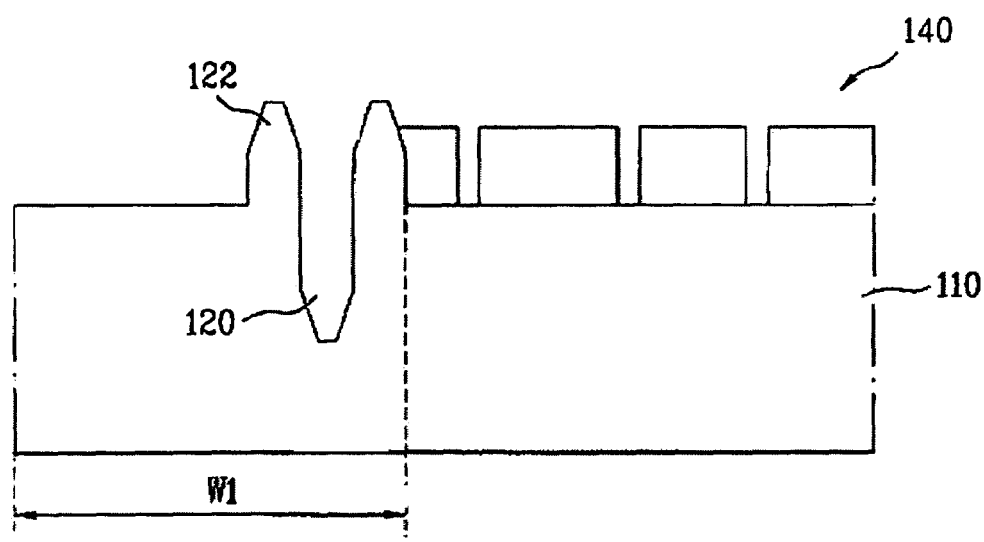

Referring to FIG. 4B, a plurality of trench patterns 140 can be formed on the wafer except an area from the edge of the wafer 120 to the width W1, using a WEE process of a trench PEP of a Damascene process.

Figure 4C:
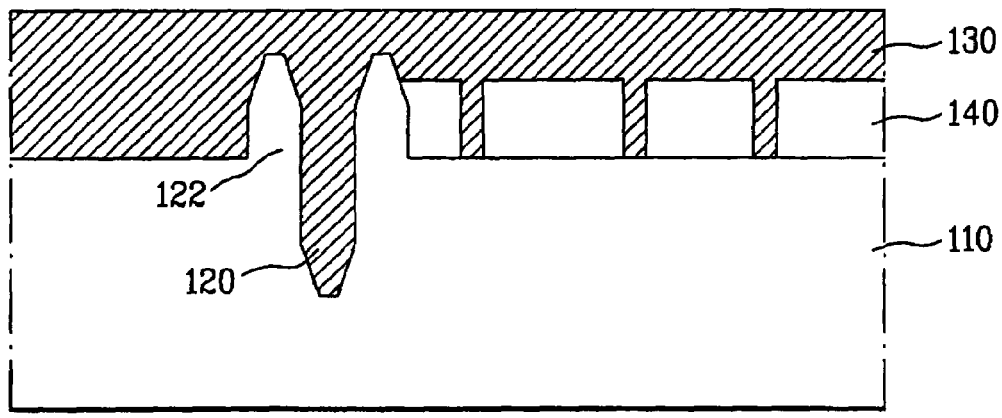

Referring to FIG. 4C, a metal interconnection layer can be formed on an entire surface of the wafer 110 to fill the laser marking 120 and the trench patterns 140. The metal interconnection layer can be formed of at least one material selected from the group consisting of aluminum (Al), Aluminum alloy (Al-alloy), copper (Cu), gold (Au), silver (Ag), tungsten (W), and molybdenum (Mo).

In this embodiment, a copper interconnection layer 130 can used as the metal interconnection layer.

Also, the metal interconnection layer can be formed using a process of reflow a conductive material formed by sputtering, a chemical vapor deposition (CVD) process, or an electroplating process.

When the electroplating process is used, a seed layer (not shown) can be formed to make a current flow during electrolysis.

In another embodiment, a diffusion barrier layer (not shown) can be formed on the trench patterns 140 before the metal interconnection layer is formed. Specifically, when the copper interconnection is formed using a Damascene process, the diffusion barrier layer prevents the dielectric characteristic of an inter-metal dielectric layer from being degraded due to the diffusion of copper.

The diffusion barrier layer can be formed of at least one material selected from the group consisting of Ta, TaN, TiN, WN, TaC, WC, TiSiN, and TaSiN.

Also, the diffusion barrier layer can be formed using a physical vapor deposition (PVD) process, a CVD process, or an atomic layer deposition (ALD).

Figure 4D:
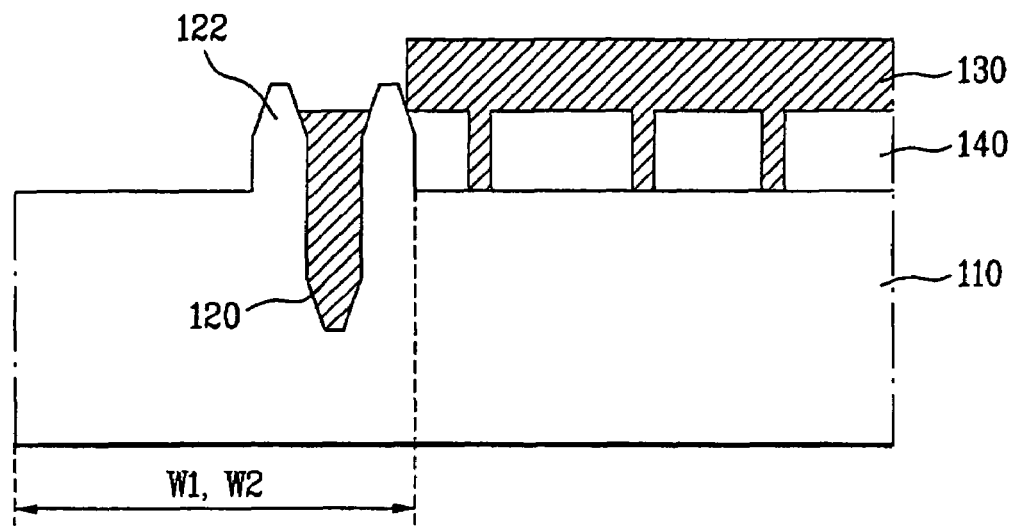

Referring to FIG. 4D, the copper film 130 disposed at a region having a second width W2 (equal to the first width W1) from the edge of the wafer 110 can be removed using an ECP (Electro Edge Exclusion) EBR (Edge Bead Removal) process.

Figure 4E:
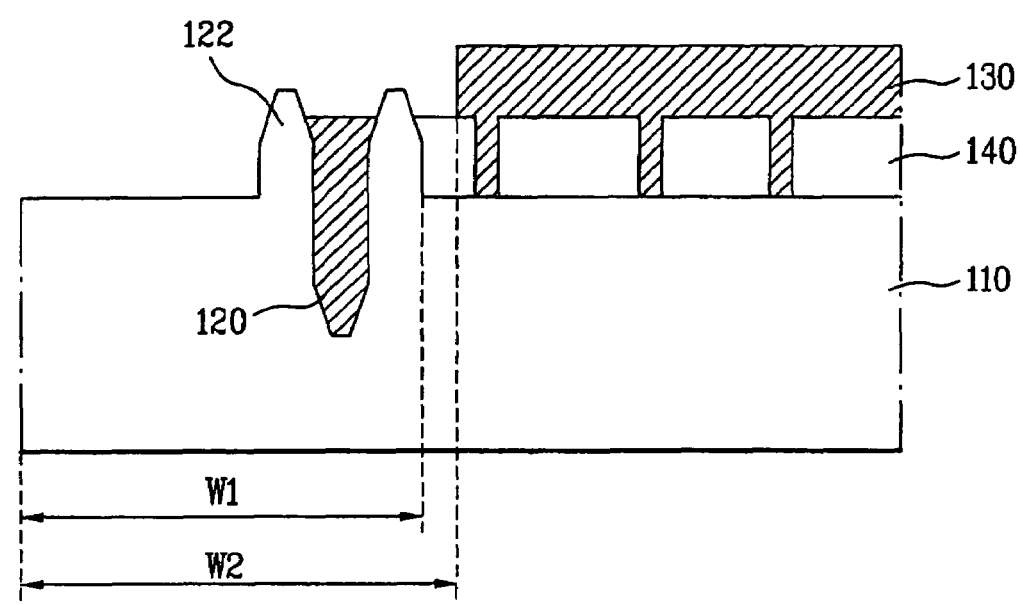

Alternatively, as illustrated in FIG. 4E, the copper film 130 disposed at a region having a second width W2 (greater than the first width W1) from the edge of the wafer 110 can be removed. The second width W2 can be greater than the first width W1, but the second width W2 can not reach the region where the trench pattern 140 is formed.

The copper ECP EBR process can over-etch the copper film 130 over 200%. The formation of the copper film 130 at the edge portion of the wafer 110 causes several contamination problems. Therefore, the copper film 130 disposed at the edge portion of the wafer is removed using chemicals through the over-etching process.

Figure 4F:
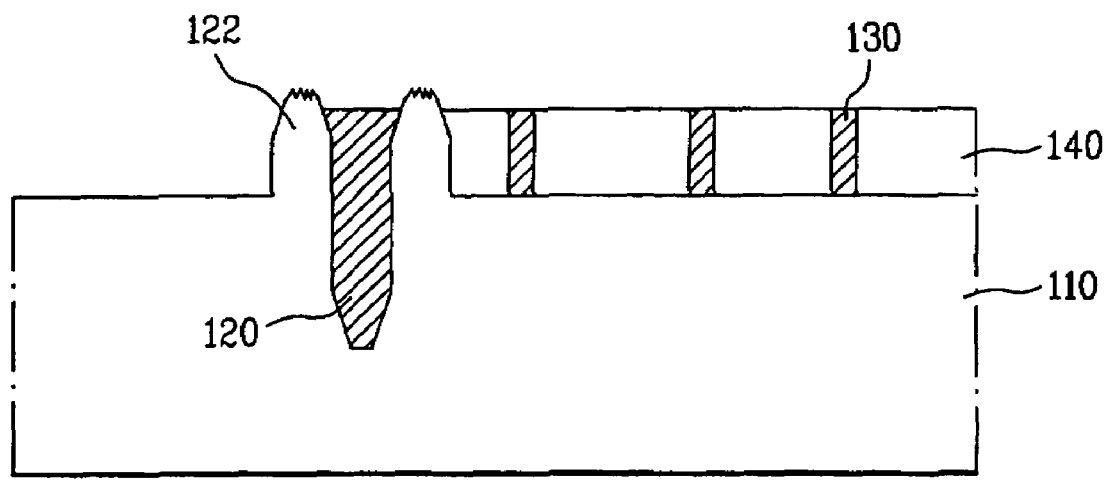

Referring to FIG. 4F, after the ECP EBR process, the copper film 130 is polished to a predetermined thickness using a copper chemical mechanical polishing (CMP) process.

The method according to an embodiment of the present invention can minimize the peeling of the copper film 130 by forming the laser marking 120 in a region where the WEE of the trench PEP having the first width W1 from the edge of the wafer overlaps the ECP EBR having the second width W2 from the edge of the wafer 110.

Also, the method according to another embodiment of the present invention can prevent the peeling of the copper film 130; the peeling is caused because the laser marking 120 does not overlap the Cu belt.

Therefore, the present invention can minimize the peeling of the copper film 130 formed on the wafer 110 by adjusting the first width W1 of the WEE of the trench PEP and the second width W2 of the ECP EBR as described above, thereby preventing the defect due to the peeling of the copper film 130.

It will be apparent to those skilled in the art that various modifications and variations can be made in the present invention. Thus, it is intended that the present invention covers the modifications and variations of this invention provided they come within the scope of the appended claims and their equivalent.

I claim:

1. A method for manufacturing a semiconductor device, comprising:

forming a laser marking in a first region of a wafer, the first region having a first width from an edge of the wafer;

forming a trench pattern above the wafer except for above the first region;

forming a metal interconnection layer above the wafer where the laser marking and the trench pattern are formed;

removing a predetermined portion of the metal interconnection layer, the predetermined portion having a second width from the edge of the wafer equal to or greater than the first width; and planarizing the metal interconnection layer above the wafer where the trench pattern is formed to a predetermined thickness, wherein the metal interconnection layer is formed of at least one material selected from the group consisting of Al, Al-alloy, Cu, Au, Ag, W, and Mo.

2. The method according to claim 1, wherein the first width is in a range of about 2.5 mm -3.0 mm from the edge of the wafer.

3. The method according to claim 1, wherein the laser marking is formed in a region where the first width and the second width overlap each other.

4. The method according to claim 1, wherein the first width is less than about 2.5 mm from the edge of the wafer.

5. The method according to claim 1, wherein the second width is equal to or greater than the first width and does not reach the region where the trench pattern is formed.

6. The method according to claim 1, wherein the removing a predetermined portion of the metal interconnection layer is accomplished by over-etching of over about 200%.

7. A method for manufacturing a semiconductor device, comprising:

forming a laser marking in a first region of a wafer, the first region having a first width from an edge of the wafer;

forming a trench pattern above the wafer except for above the first region;

forming a metal interconnection layer above the wafer where the laser marking and the trench pattern are formed;

removing a predetermined portion of the metal interconnection layer, the predetermined portion having a second width from the edge of the wafer equal to or greater than the first width; and planarizing the metal interconnection layer above the wafer where the trench pattern is formed to a predetermined thickness, wherein planarizing the metal interconnection layer is accomplished by a chemical mechanical polishing (CMP) process.

8. A method for manufacturing a semiconductor device, comprising:

forming a laser marking in a first region of a wafer, the first region having a first width from an edge of the wafer;

forming a trench pattern above the wafer except for above the first region;

forming a metal interconnection layer above the wafer where the laser marking and the trench pattern are formed;

removing a predetermined portion of the metal interconnection layer, the predetermined portion having a second width from the edge of the wafer equal to or greater than the first width; and planarizing the metal interconnection layer above the wafer where the trench pattern is formed to a predetermined thickness, wherein forming the metal interconnection layer is accomplished by using at least one process selected from the group consisting of a reflowing of a conductive material formed by sputtering, a chemical vapor deposition (CVD) process, and an electroplating process.

9. The method according to claim 8, further comprising forming a seed layer to make a current flow during electrolysis when the electroplating process is used.

10. A method for manufacturing a semiconductor device, comprising:

forming a laser marking in a first region of a wafer, the first region having a first width from an edge of the wafer;

forming a trench pattern above the wafer except for above the first region;

forming a diffusion barrier layer on the trench pattern;

forming a metal interconnection layer above the wafer where the laser marking, the trench pattern, and the diffusion barrier layer are formed;

removing a predetermined portion of the metal interconnection layer, the predetermined portion having a second width from the edge of the wafer equal to or greater than the first width; and planarizing the metal interconnection layer above the wafer where the trench pattern is formed to a predetermined thickness.

11. The method according to claim 10, wherein the diffusion barrier layer is formed of at least one material selected from the group consisting of Ta, TaN, TiN, WN, TaC, WC, TiSiN, and TaSiN.

12. The method according to claim 10, wherein forming the diffusion barrier layer is accomplished by using at least one process selected from the group consisting of a physical vapor deposition (PVD) process, and an atomic layer deposition (ALD) process.

* * * * *